United States Patent
Kwon et al.

[11] Patent Number: 6,140,174
[45] Date of Patent: Oct. 31, 2000

[54] METHODS OF FORMING WIRING LAYERS ON INTEGRATED CIRCUITS INCLUDING REGIONS OF HIGH AND LOW TOPOGRAPHY

[75] Inventors: Chul-Soon Kwon; Ju-Won jang, both of Seoul; Yong-Bae Choi, Kyungki-do, all of Rep. of Korea

[73] Assignee: Samsung Electronics Co., Ltd., Rep. of Korea

[21] Appl. No.: 09/338,708

[22] Filed: Jun. 23, 1999

[30] Foreign Application Priority Data

Sep. 22, 1998 [KR] Rep. of Korea ............... 98-39246

[51] Int. Cl.[7] .................................. H01L 21/8242
[52] U.S. Cl. .................... 438/241; 438/622; 438/624; 438/631
[58] Field of Search ................... 438/622, 624, 438/626, 631, 633, 241

[56] References Cited

U.S. PATENT DOCUMENTS

| | | | |
|---|---|---|---|
| 5,288,655 | 2/1994 | Higasitani et al. | 438/624 |
| 5,389,558 | 2/1995 | Suwanai et al. | 438/622 |
| 5,670,409 | 9/1997 | Otori et al. | 438/622 |
| 5,763,954 | 6/1998 | Hyakutake | 257/774 |
| 5,869,392 | 2/1999 | Kimura | 438/620 |
| 5,937,322 | 8/1999 | Matsuura | 438/622 |

*Primary Examiner*—T. N. Quach
*Attorney, Agent, or Firm*—Myers Bigel Sibley & Sajovec

[57] ABSTRACT

Integrated circuits include an integrated circuit substrate and a plurality of active regions and isolation regions in the integrated circuit substrate. A plurality of conductive and insulating layers are included on the integrated circuit substrate that define regions of high and low topography on the integrated circuit substrate. An underlying wiring layer is provided on the low topography region, but not on the high topography region. An overlying wiring layer is provided on the low topography region and on the high topography region. An insulating layer is provided between the underlying wiring layer and the overlying wiring layer. Memory integrated circuit, DRAM integrated circuit, MML integrated circuit and MDL integrated circuit embodiments may be provided.

16 Claims, 3 Drawing Sheets

METHODS OF FORMING WIRING LAYERS ON INTEGRATED CIRCUITS INCLUDING REGIONS OF HIGH AND LOW TOPOGRAPHY

FIELD OF THE INVENTION

This invention relates to integrated circuit fabrication methods, and more particularly to methods of forming wiring layers on integrated circuits, and integrated circuits formed thereby.

BACKGROUND OF THE INVENTION

Integrated circuits are widely used in consumer and commercial applications. As the integration density of integrated circuit devices continues to increase, topography differences on the integrated circuit may continue to increase. These topography differences between regions of high and low topography may make it increasingly difficult to form high density interconnections, also referred to as wiring layers, on integrated circuits. As used herein, the terms "high" and "low" are used to define topography differences relative to one another, without indicating absolute topography levels.

In particular, in integrated circuit memory devices, the region of high topography generally includes a memory cell array region, while the region of low topography generally includes a peripheral circuit region in which circuits that are used to support the memory cell array are fabricated. More specifically, in a Dynamic Random Access Memory (DRAM) integrated circuit, the region of high topography generally includes a DRAM cell array region that includes a plurality of capacitors therein, and the region of low topography includes a DRAM peripheral circuit region. In DRAM devices that include stacked capacitors, topography differences of up to 1 μm or more may be present.

Finally, it is also known to provide Merged Memory and Logic (MML) integrated circuits that merge the functions of memory integrated circuits and logic integrated circuits into a single integrated circuit substrate. In these MML integrated circuits, the region of high topography generally includes a memory cell array region and the region of low topography generally includes a logic circuit region. Particularly for Merged DRAM and Logic (MDL) integrated circuits, topography differences of up to 1 μm or more may be present, due to the use of stacked capacitors or other three-dimensional capacitor structures in the memory array region.

FIGS. 1–3 are cross-sectional views illustrating the fabrication of conventional DRAM devices in order to illustrate how these large topography differences can arise. FIGS. 1–3 illustrate a DRAM fabrication process in which a Capacitor-On-Bitline (COB) structure is utilized. In FIGS. 1–3, reference letter A indicates a region of high topography, specifically the DRAM cell array region, and reference letter B indicates a region of low topography, specifically a DRAM peripheral circuit region.

Referring now to FIG. 1, a field oxide layer 12 is formed in an element-isolation zone of an integrated circuit substrate such as a semiconductor substrate 10, so that the active zone where an active element is formed thereon is defined. A gate insulating layer is formed in the active zone of the substrate 10, and gate electrodes 14 are formed on predetermined parts of the gate insulating layer and the field oxide layer 12, respectively.

Next, the substrate 10 is ion-implanted by a low concentration of dopants. Thereafter, spacers 16 comprising insulating material are formed on both sidewalls of the gate electrode 14. The substrate 10 is ion-implanted by dopants of high concentration, to form source/drain regions having a Lightly Doped Drain (LDD) structure in the substrate 10 where both edges of the gate electrode 14 are positioned. As a result, a Field Effect Transistor (FET) is formed.

A buffer oxide layer 18 is formed on the substrate 10 including on the gate electrodes 14 and on the field oxide layer 12. A first insulating layer 20 comprising a high-temperature oxide film-type material, such as Boron Phosphorus Silicate Glass (BPSG), is formed on the surface resulting from the above process, and the first insulating layer 20 is allowed to reflow at a predetermined temperature. The formation of the buffer oxide layer 18 can prevent the transistor from being damaged by doping of P-ions or B-ions into the gate electrode 14, which may occur when the first insulating layer 20 is formed with a high-temperature oxide film-type material such as BPSG, or from being damaged by plasma, which can occur when the film is formed by evaporation.

First direct contact holes are formed by selectively etching a predetermined part of the first insulating layer 20 so that the surface of the substrate 10 on which bit lines will be formed is exposed. A conductive film is formed on the first insulating layer 20 including in the first contact hole, also referred to as a Direct Contact (DC) hole. Bit line 22 is formed by selectively etching so that the surface of the insulating layer 20 is partly exposed.

As shown in FIG. 2, a second insulating layer 24 comprising a high-temperature oxide film-type material (for example BPSG) is formed on the first insulating layer 20 including on the bit line 22. The second insulating layer 24 is allowed to reflow at a predetermined temperature. Second contact holes, also referred to as Buried Contact (BC) holes, are formed by selectively etching predetermined parts of the second insulating layer 24, the first insulating layer 20 and the buffer oxide layer 18 so that the surface of the substrate 10, wherein a capacitor will be formed, is partly exposed. A conductive layer comprising polysilicon including dopants of high concentration, is formed on the second insulating layer 24 including in the second buried contact hole. A storage electrode 26 is formed on the high topography region A by selectively etching the conductive layer. A dielectric layer 28 is formed on the surface of the storage electrode 26. A conductive layer comprising polysilicon including dopants of high concentration is formed on the second insulating layer 24 including on the dielectric layer 28. A plate electrode 30 is formed by selectively etching the conductive layer. As a result, a stacked capacitor structure including the storage electrode 26, the dielectric layer 28 and the plate electrode 30 is formed in the high topography memory cell array region A.

A third insulating layer 32 comprising high temperature oxide film-type material (for example BPSG) is formed on the second insulating layer 24 including on the capacitor. The third insulating layer is allowed to reflow at a predetermined temperature. Thereafter, third contact holes having various aspect ratios are formed by etching in order the first, second and third insulating layers 20, 24, 32, the buffer oxide layer 18 and the gate insulating layer, so that the surface of the plate electrode 30 in the low topography peripheral circuit region B and the surface in the active region are partly exposed.

A glue metal layer having a structure such as "Ti/TiN", a conductive layer comprising Al-based alloy and an anti-reflection layer comprising TiN are formed on the third insulating layer 32 including in the third contact hole. Thereafter, a first metal wiring layer 34 is formed on the high topography memory cell array region A and the low topography peripheral circuit region B, by etching predetermined portions of the layer.

Referring now to FIG. 3, a fourth insulating layer 36 such as "Undoped Silicon Glass (USG)/Silicon-on-Glass (SOG)" is formed on the third insulating layer 32 including on the first metal wire 34. The fourth insulating layer 36 is planarized by using an SOG etch-back process. Via holes are formed in the fourth insulating layer 36 by selectively etching the fourth insulating layer 36 so that the surface of the first wiring layer 34 formed in the peripheral circuit region B is partly exposed.

A glue metal layer having a structure such as "Ti/TiN", a conductive layer comprising Al-based alloy and an anti-reflection layer comprising TiN are formed on the fourth insulating layer 36 including in the via holes. Thereafter, a second wiring layer 38 is formed on the high topography memory cell array region A and on the low topography peripheral circuit region B, by etching predetermined portions of the second wiring layer, to complete the process.

As shown in FIG. 2, for a conventional DRAM device, the first metal wiring layer 34 is formed by forming a conductive film and then etching, while the topography difference between the memory cell array region A and the peripheral circuit region B may be up to 1.0 $\mu$m or more due to the capacitor formed in the memory cell region A. This topography difference may create fabrication problems.

In particular, in a conventional DRAM device with a topography difference of 1.0 $\mu$m or more, it may be difficult to find a photolithography margin that can be applied to both the high topography memory cell array region A and the low topography peripheral circuit region B. For this reason, the design rule may need to be set so that pitch of the first metal wiring layer 34 has enough margin for the formation of the desired metal pattern.

However, if the design rule is set so that the pitch of the first metal wiring layer 34 has enough margin when the DRAM device is designed, the first metal wiring layer pitch in the peripheral circuit region may need to be set to a similar level. This may produce low gate density in the peripheral circuit region. For example, in an MML/MDL integrated circuit, gate density in the logic region may not be comparable to a pure logic integrated circuit. Thus, MML/MDL integrated circuits with high performance may be difficult to fabricate.

SUMMARY OF THE INVENTION

It is therefore an object of the present invention to provide improved methods of forming wiring layers on integrated circuits and integrated circuits formed thereby.

It is another object of the present invention to provide improved methods of forming wiring layers on integrated circuits including regions of high and low topography, and integrated circuits formed thereby.

These and other objects can be provided, according to the present invention, by forming an underlying wiring layer on a low topography region, but not on a high topography region on an integrated circuit. Then, an insulating layer is formed on at least the low topography region. Then, an overlying wiring layer is formed on the low topography region and on the high topography region. It will be understood that the terms "underlying" and "overlying" are used to refer to the relationship of the two wiring layers to one another on the integrated circuit.

By forming an underlying wiring layer on the low topography region but not on the high topography region, a high density underlying wiring layer may be formed because the topography differences need not be accounted for. Moreover, the overlying wiring layer that is then formed on the low topography region and on the high topography region can have reduced topography difference due to the formation of the underlying wiring layer on the low topography region but not on the high topography region. Accordingly, both the underlying wiring layer and the overlying wiring layer may be formed at high density.

In one embodiment of the present invention, the integrated circuit is a memory integrated circuit wherein the region of high topography comprises a memory cell array region and wherein the region of low topography comprises a peripheral circuit region. The underlying wiring layer comprises a first level metal wiring layer and the overlying wiring layer comprises the first level metal wiring layer in the region of high topography and a second level metal wiring layer in the region of low topography. The integrated circuit also may be DRAM integrated circuit, so that the region of high topography comprises a DRAM memory cell array region including a plurality of capacitors therein, and the region of low topography comprises a DRAM peripheral circuit region.

In yet another embodiment, the integrated circuit is an MML integrated circuit wherein the region of high topography comprises a memory cell array region, and the region of low topography comprises a logic circuit region. Finally, in yet another embodiment, the integrated circuit is an MDL integrated circuit wherein the region of high topography comprises a DRAM cell array region including a plurality of stacked capacitors therein and wherein the region of low topography comprises a logic circuit region.

Integrated circuits according to the present invention include an integrated circuit substrate and a plurality of active regions and isolation regions in the integrated circuit substrate. A plurality of conductive and insulating layers are included on the integrated circuit substrate that define regions of high and low topography on the integrated circuit substrate. An underlying wiring layer is provided on the low topography region, but not on the high topography region. An overlying wiring layer is provided on the low topography region and on the high topography region. An insulating layer is provided between the underlying wiring layer and the overlying wiring layer. Memory integrated circuit, DRAM integrated circuit, MML integrated circuit and MDL integrated circuit embodiments may be provided, as was described above.

Since the first metal wiring layer of the memory cell region and the second metal wiring layer of the peripheral region may be formed simultaneously, defects that are caused by topography differences and/or performance impacts that are caused by depth-of-focus restrictions, may be reduced and preferably may be eliminated. Thus, for example, in an MML integrated circuit, the pitch of the first metal wiring layer and the second metal wiring layer in the logic region can be formed at the same level as high performance logic integrated circuits.

DETAILED DESCRIPTION OF PREFERRED EMBODIMENTS

Figure 1:
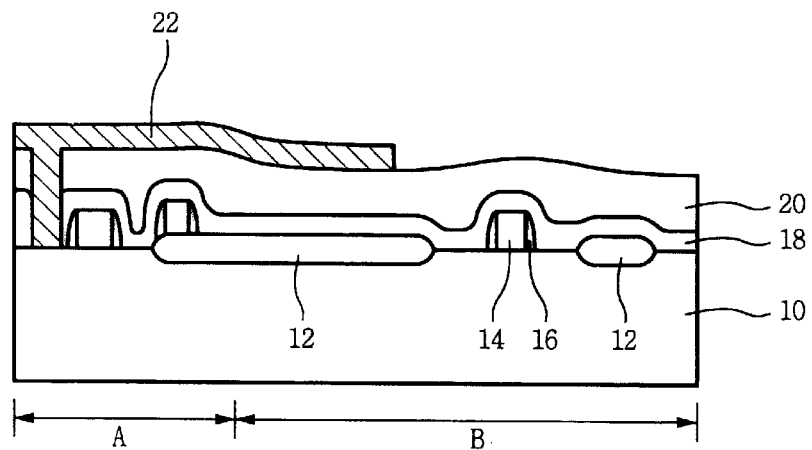
FIGS. 1–3 are cross-sectional views of conventional DRAM devices during intermediate fabrication steps.
Figure 2:
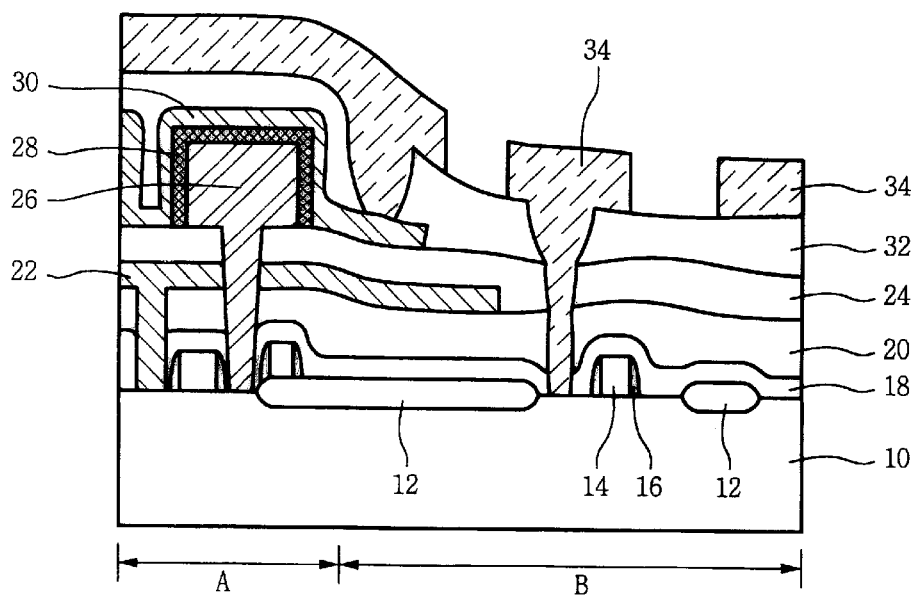
Figure 3:
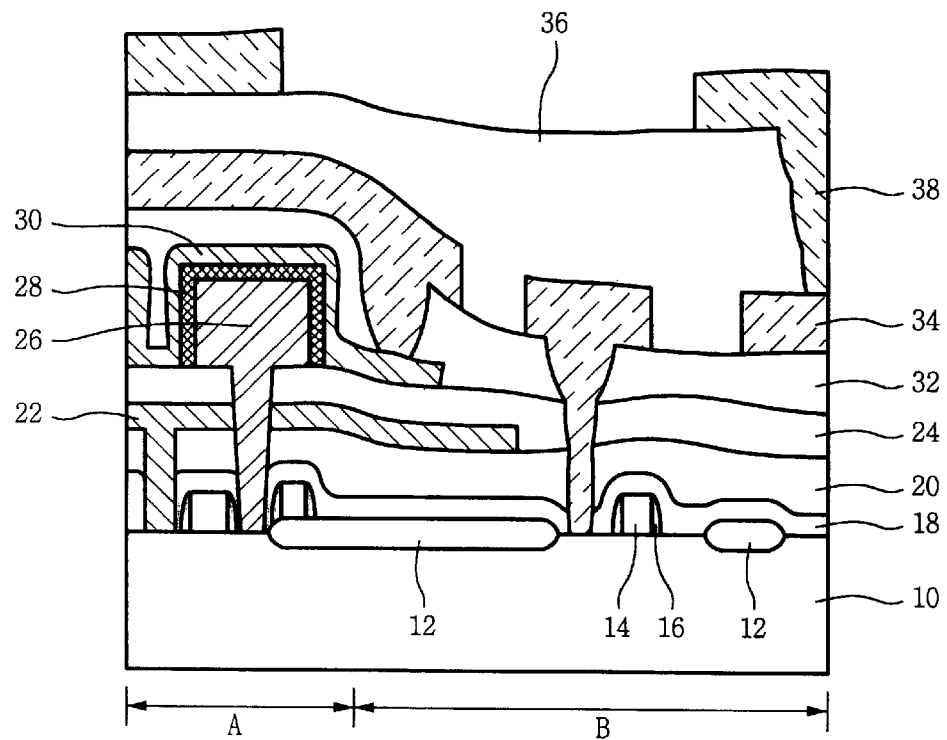

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

According to the present invention, a first level metal wiring layer is only formed in a region of low topography, such as a peripheral circuit region or logic circuit region. Then, the second level metal wiring layer in the region of low topography and a first level metal wiring layer in the region of high topography, such as a memory cell array region, are simultaneously formed. This can allow high pitch wiring to be formed for both the memory cell array region and the peripheral circuit or logic region, notwithstanding the large topography differences between these regions of up to 1.0 μm or more. When fabricating an MML integrated circuit, the logic region therefore can achieve performance levels of separate logic integrated circuits.

Figure 4:
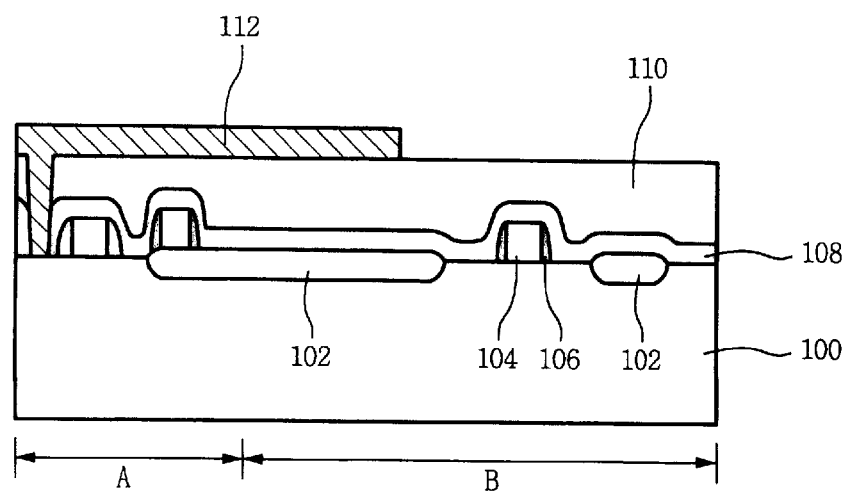
FIGS. 4–6 are cross-sectional views of DRAM integrated circuits according to the present invention during intermediate fabrication steps.
Figure 5:
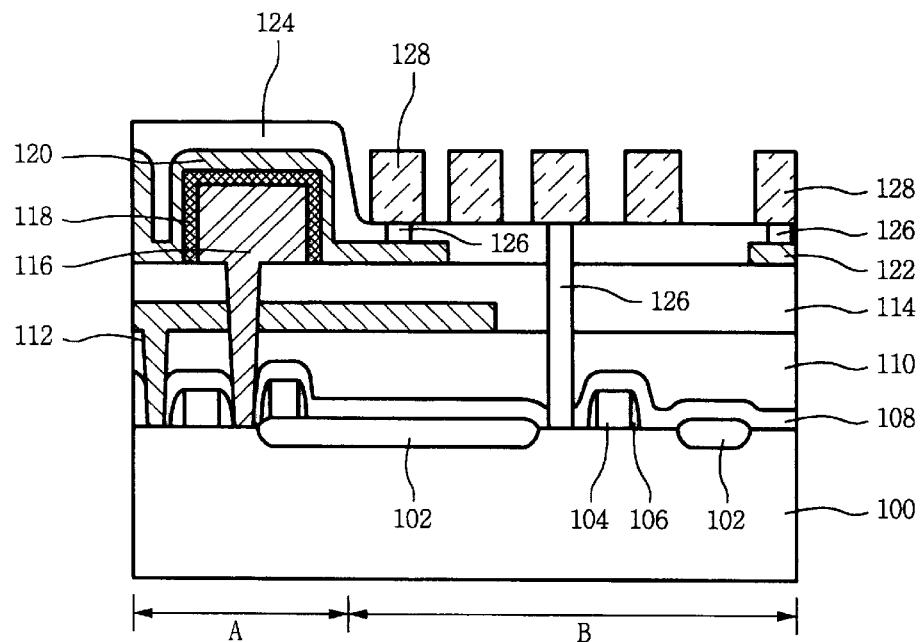
Figure 6:
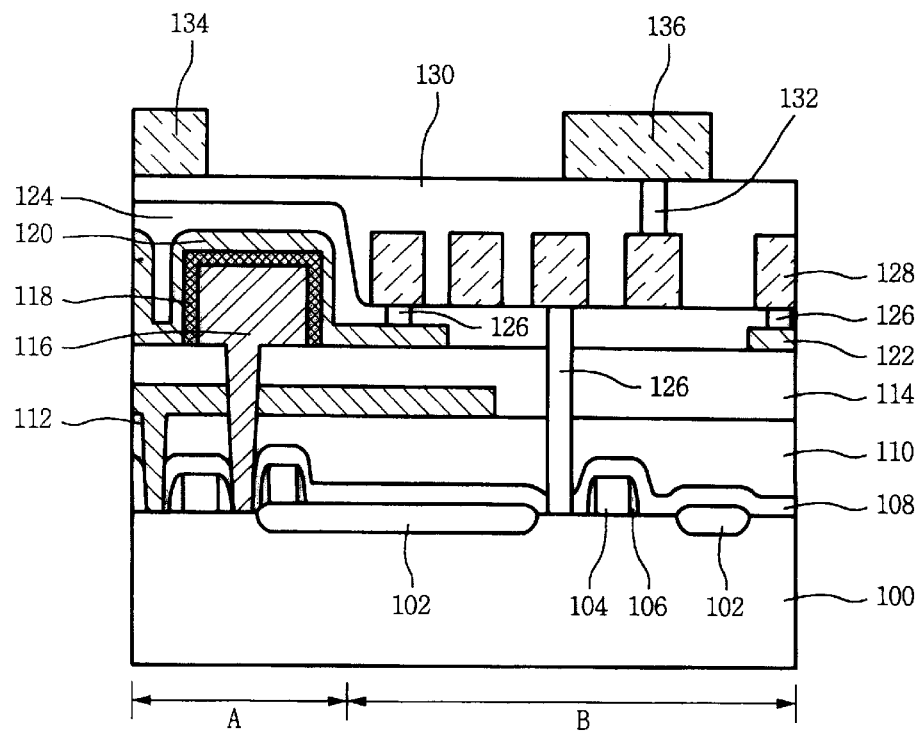

FIGS. 4–6 are cross-sectional views illustrating DRAM integrated circuits according to the present invention during intermediate fabrication steps. Similar fabrication steps may be applied to MML integrated circuits. In FIGS. 4–6, reference designation A designates the region of high topography, such as a memory cell array region. Reference designation B indicates the region of low topography, such as a peripheral circuit region or a logic circuit region, also referred to herein as a peripheral/logic circuit region.

Referring now to FIG. 4, field oxide regions 102 or other isolation regions are formed in an element isolation region of an integrated circuit substrate such as a semiconductor substrate 100, so that an active region in which active elements are formed is defined. A gate insulating layer in the active region of the substrate 100 is formed, and gate electrodes 104 are formed on predetermined parts of the gate insulating layer and the field oxide region 102, respectively.

Next, dopants of low concentration are implanted into the substrate 100. Spacers 106 comprising an insulator material are formed on both sidewalls of the gate electrodes 104, and source/drain regions having an LDD structure are formed in the substrate 100. As a result, an FET is formed. A buffer oxide layer 108 then is formed on the substrate 100, including on the gate electrodes 104 and on the field oxide regions 102.

A first insulating layer 110, comprising for example a low temperature oxide film, is then formed on the substrate 100. The first insulating layer 110 is flattened, for example utilizing an etch-back process and/or a CMP process.

First contact holes (DC) are formed by selectively etching the first insulating layer 110 so that the surface of the substrate 100 where bit lines are formed is exposed. A conductive layer is formed on the first insulating layer 110 including in the first contact holes. Thereafter, bit lines 112 are formed by selectively etching the conductive layer so that predetermined portions of the surface of the insulating layer 110 are exposed.

As shown in FIG. 5, a second insulating layer 114, comprising for example a low temperature oxide film, is formed on the first insulating layer 110 including on the bit line 112. The second insulating layer 114 is planarized using an etch-back process and/or a CMP process. Second contact holes (BC) are formed by selectively etching the second insulating layer 114, the first insulating layer 110 and the buffer oxide layer 108, so that the surface of the substrate in the capacitor region is partly exposed. A conductive layer, preferably comprising polysilicon including dopants of high concentration, is formed on the second insulating layer 114 including in the second contact hole. A storage electrode 116 is formed in the memory cell array region A by selectively etching the conductive layer.

A capacitor dielectric layer 118 is formed on the storage electrode 116. A conductive layer, for example comprising polysilicon including dopants of high concentration, is formed on the second insulating layer 114 including on the capacitor dielectric layer 118. Thereafter, a resistance terminal 122 and a plate electrode 120 are defined by selective etching. As a result, a capacitor having a stacked structure of the storage electrode 116/the dielectric layer 118/the plate electrode 120 is formed. The storage electrode 116 included in the capacitor may be more than 7000 Å in height in order to provide more than 30 fF/cell in electrostatic capacitance for a DRAM cell. For that reason, the height difference between the memory cell array region A and the peripheral/logic circuit region B may be more than 1.0 μm.

A third insulating layer 124, for example comprising a low temperature oxide film, is formed and planarized through an etch-back process. Third contact holes having respective different length/width ratios are formed by etching the first, second and third insulating layers 110, 114, 124, the buffer oxide layer 108 and the gate insulating layer, so that the surfaces of the plate electrode 120, the active region in the peripheral/logic circuit region B, and the surface of the resistance terminal 122 in the peripheral/logic circuit region B are exposed, respectively.

First conductive plugs 126, comprising for example W or Al-based alloy, are formed in the third contact holes. A barrier metal layer having a stack structure of "Ti/TiN" may be formed beneath the first conductive plugs 126. A glue metal layer having a stack structure of "Ti/TiN", a conductive layer comprising for example Al-based alloy or Cu-based alloy, and an anti-reflection layer comprising, for example, TiN, may be formed on the third insulating layer 124 including on the conductive plug 126. These layers are selectively etched so that the entire surface of the third insulating layer 124 in the memory cell array region A and a predetermined surface of the third insulating layer 124 in the peripheral/logic circuit region B are allowed to be exposed. As a result, a plurality of first metal wires 128 are formed in the peripheral/logic circuit region B on the third insulating layer 124. The first metal wires 128 may include anti-reflection layers and glue metal layers on their respective upper and lower sides. The first conductive plugs 126 may comprise Cu-based alloy, W or Al-based alloy. When the first conductive plugs 126 comprise Cu-based alloy, the barrier metal layer in the third contact hole preferably comprises $W_xN_y$.

As described above, the metal wiring layer 128 is not formed on the insulating layer 124 in the high topography memory cell array region A, but is formed in the low topography peripheral/logic circuit region B. If the first metal wiring layer 128 also is formed on the third insulating layer 124 in the memory cell region A, it may be difficult to obtain photolithography margins which can satisfy the high topography region A and the low topography region B, due to limits in the depth of focus during the photo-etching for forming the wiring layer. Accordingly, the first metal wiring layer pitch in the peripheral/logic circuit region B may not reach the level of a design rule corresponding to the pure-logic circuit design, for example a level of 0.93 to 0.97 $\mu$m.

Referring now to FIG. 6, a fourth insulating layer 130, for example comprising low temperature oxide film, is formed on the third insulating layer 124 including on the first metal wiring layer 128. The fourth insulating layer 130 is flattened, for example by a CMP process. Via holes are formed by selectively etching the fourth insulating layer 130 so that the surface of the first metal wiring layer 128 is partly exposed. Since the evaporation and etching processes to form the fourth insulating layer 130 are performed on a substrate on which the first metal wiring layer 128 was formed only on the relatively lower topography region B, the via holes may have an aspect ratio less than 3:1.

A second conductive plug 132, comprising for example W or Al-based alloy, is formed in the via holes. A barrier metal layer having a stack structure of "Ti/TiN" may be formed beneath the second conductive plugs 132. A glue metal layer, for example having a stack structure of "Ti/TiN", a conductive layer comprising for example Al-based alloy or Cu-based alloy, and an anti-reflection layer comprising for example TiN, are formed on the fourth insulating layer 130 including on the conductive plugs 132. These layers are selectively etched so that the predetermined surfaces of the fourth insulating layer 130 are exposed. Thus, a first metal wiring layer 134 is formed on the memory cell array region A and second metal wiring layer 136 is formed on the peripheral/logic circuit region B.

The first metal wiring layer 134 formed in the memory cell array region A and the second metal wiring layer 136 formed in the peripheral/logic circuit region B may include anti-reflection layers and glue metal layers on the respective upper and lower sides as described above. The conductive layers preferably are formed on the upper and lower sides of the metal wiring layers 134, 136 prior to the formation of the anti-reflection and glue metal layers. The second metal wiring layer 136 is connected to the first metal wiring layer 128 through the second conductive plugs 132. The second conductive plugs 132 may comprise for example Cu-based alloy, W or Al-based alloy. When the second conductive plugs 126 comprise Cu-based alloy, the barrier metal layer in the via hole preferably comprises WxNy.

As a result, as shown in FIG. 6, the first to third insulating layers 110, 114, 124 are formed on a substrate 100 provided with a capacitor having a COB structure and/or stacked structure. The first metal wiring layer 128 is formed on the third insulating layer 124 of the peripheral/logic circuit region B, but not on the memory cell region A. The fourth insulating layer 130 is formed on the third insulating layer 124 including on the first metal wiring layer 128. The first metal wiring layer 134 is formed on the fourth insulating layer 130 of the memory cell array region A. The second metal wiring layer 136 is formed on the fourth insulating layer 130 in the peripheral/logic circuit region B.

Since the first metal wiring layer 128 is first formed in the peripheral/logic circuit region B where its height is lower than the memory cell array region A, the photolithography margin may be efficiently maintained during photo-etching for the formation of wiring layers. The pitch of the first metal wiring layer 128 thereby can reach the level of a design rule of a pure logic circuit.

Moreover, the length/width ratio (aspect ratio) may be reduced to about 4 or less, compared with the case where the third insulating layer 124 has sufficient thickness and is planarized through a CMP process and thereafter the contact holes are formed. Accordingly, the present invention can prevent deterioration in profile characteristics caused by a process for forming the deep contact, to thereby allow improved reliability. Finally, since the evaporation and planarization process for forming the fourth insulating layer 130 may be performed while the first metal wiring layer 128 is formed only in the peripheral region B, the topography difference between the memory cell array region A and the peripheral/logic circuit region B can be reduced and/or eliminated.

When fabricating an MDL integrated circuit in which the topography difference between the memory cell array region and the logic circuit region may be more than 1.0 $\mu$m, the present invention can be practiced such that the first metal wiring layer in the memory cell array region and the second metal wiring layer in the logic circuit region are simultaneously formed after the first metal wiring layer is first formed in the logic circuit region. Many advantages may be obtained. For example, sufficient photolithography margin can be maintained by the process during the formation of wiring layers, so that the first metal wire pitch in the logic circuit region can maintain the design rule of a pure logic circuit. Moreover, the length/width ratio (aspect ratio) of the deep contact hole can reach 4, so that reliability problems caused by higher aspect ratio contact holes can be reduced. Finally, planarization between the memory cell region A and the logic circuit region B can be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming wiring layers on an integrated circuit including a first region of first topography and a second region of second topography that is higher than the first region, the method comprising the steps of:

forming an underlying wiring layer on the first region but not on the second region such that the underlying wiring layer on the first region reduces a topography difference between the first and second regions; then forming an insulating layer on at least the underlying wiring layer; and then forming an overlying wiring layer on the first and second regions that have the reduced topography difference that results from the step of forming an underlying wiring layer on the first region but not on the second region.

2. A method according to claim 1 wherein the integrated circuit is a memory integrated circuit, wherein the second region comprises a memory cell array region and wherein the first region comprises a peripheral circuit region, wherein the underlying wiring layer comprises a first level metal wiring layer and wherein the overlying wiring layer comprises a first level metal wiring layer in the second region and a second level metal wiring layer in the first region.

3. A method according to claim 1 wherein the integrated circuit is a dynamic random access memory integrated circuit, wherein the second region comprises a dynamic random access memory cell array region including a plurality of capacitors therein and wherein the first region comprises a dynamic random access memory peripheral circuit region, wherein the underlying wiring layer comprises a first level metal wiring layer and wherein the overlying wiring layer comprises a first level metal wiring layer in the second region and a second level metal wiring layer in the first region.

4. A method according to claim 1 wherein the integrated circuit is a merged memory and logic integrated circuit, wherein the second region comprises a memory cell array region and wherein the first region comprises a logic circuit region, wherein the underlying wiring layer comprises a first level metal wiring layer and wherein the overlying wiring layer comprises a first level metal wiring layer in the second region and a second level metal wiring layer in the first region.

5. A method according to claim 1 wherein the integrated circuit is a merged dynamic random access memory and logic integrated circuit, wherein the second region comprises a dynamic random access memory cell array region including a plurality of capacitors therein and wherein the first region comprises a logic circuit region, wherein the underlying wiring layer comprises a first level metal wiring layer and wherein the overlying wiring layer comprises a first level metal wiring layer in the second region and a second level metal wiring layer in the first region.

6. A method according to claim 1 wherein the step of forming an overlying wiring layer on the first and second regions comprises the step of forming at least one conductive plug in the insulating layer that electrically connects to the underlying wiring layer.

7. A method according to claim 1 wherein the underlying wiring layer and the overlying wiring layer both comprise metal.

8. A method according to claim 1, wherein the integrated circuit is a memory integrated circuit, wherein the second region comprises a memory cell array region and wherein the first region comprises a peripheral circuit region, wherein the underlying wiring layer comprises a first level metal wiring layer and wherein the overlying wiring layer comprises a first level metal wiring layer in the second region, such that the first level metal wiring layer in the memory cell array region and in the peripheral circuit region are formed in two separate steps.

9. A method of forming an integrated circuit comprising the steps of:

forming a plurality of active regions and isolation regions in an integrated circuit substrate;

forming a plurality of conductive and insulating layers on the integrated circuit substrate to define a first region of first topography and a second region of second topography that is higher than the first region on the integrated circuit substrate;

forming an underlying wiring layer on the first region but not on the second region such that the underlying wiring layer on the first region reduces a topography difference between the first and second regions; then forming an insulating layer on at least the underlying wiring layer; and then forming an overlying wiring layer on the first and second regions that have the reduced topography different that results from the step of forming an underlying wiring layer on the first region but not on the second region.

10. A method according to claim 9 wherein the integrated circuit is a memory integrated circuit, wherein the second region comprises a memory cell array region and wherein the first region comprises a peripheral circuit region, wherein the underlying wiring layer comprises a first level metal wiring layer and wherein the overlying wiring layer comprises a first level metal wiring layer in the second region and a second level metal wiring layer in the first region.

11. A method according to claim 9 wherein the integrated circuit is a dynamic random access memory integrated circuit, wherein the second region comprises a dynamic random access memory cell array region including a plurality of capacitors therein and wherein the first region comprises a dynamic random access memory peripheral circuit region, wherein the underlying wiring layer comprises a first level metal wiring layer and wherein the overlying wiring layer comprises a first level metal wiring layer in the second region and a second level metal wiring layer in the first region.

12. A method according to claim 9 wherein the integrated circuit is a merged memory and logic integrated circuit, wherein the second region comprises a memory cell array region and wherein the first region comprises a logic circuit region, wherein the underlying wiring layer comprises a first level metal wiring layer and wherein the overlying wiring layer comprises a first level metal wiring layer in the second region and a second level metal wiring layer in the first region.

13. A method according to claim 9 wherein the integrated circuit is a merged dynamic random access memory and logic integrated circuit, wherein the second region comprises a dynamic random access memory cell array region including a plurality of capacitors therein and wherein the first region comprises a logic circuit region, wherein the underlying wiring layer comprises a first level metal wiring layer and wherein the overlying wiring layer comprises a first level metal wiring layer in the second region and a second level metal wiring layer in the first region.

14. A method according to claim 9 wherein the step of forming an overlying wiring layer on the first and second regions comprises the step of forming at least one conductive plug in the insulating layer that electrically connects to the underlying wiring layer.

15. A method according to claim 9 wherein the underlying wiring layer and the overlying wiring layer both comprise metal.

16. A method according to claim 9, wherein the integrated circuit is a memory integrated circuit, wherein the second region comprises a memory cell array region and wherein the first region comprises a peripheral circuit region, wherein the underlying wiring layer comprises a first level metal wiring layer and wherein the overlying wiring layer comprises a first level metal wiring layer in the second region, such that the first level metal wiring layer in the memory cell array region and in the peripheral circuit region are formed in two separate steps.

* * * * *